(12) United States Patent
Harris et al.

(10) Patent No.: US 6,771,090 B2
(45) Date of Patent: Aug. 3, 2004

(54) INDEXING ROTATABLE CHUCK FOR A PROBE STATION

(75) Inventors: Daniel L. Harris, Beaverton, OR (US); Peter R. McCann, Beaverton, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

(21) Appl. No.: 10/179,796

(22) Filed: Jun. 24, 2002

(65) Prior Publication Data

US 2002/0153877 A1 Oct. 24, 2002

Related U.S. Application Data

(63) Continuation of application No. 09/564,591, filed on May 3, 2000, now Pat. No. 6,483,336.

(51) Int. Cl.[7] .................. G01R 31/26; H01R 31/02; B25B 11/00
(52) U.S. Cl. ................. 324/765; 324/537; 269/21
(58) Field of Search ............... 324/537, 754, 324/758, 765; 269/20–21

(56) References Cited

U.S. PATENT DOCUMENTS

| | | |
|---|---|---|
| 2,389,668 A | 11/1945 | Johnson |
| 3,829,076 A | 8/1974 | Sofy |
| 3,936,743 A | 2/1976 | Roch |
| 4,008,900 A | 2/1977 | Khoshaba |
| 4,038,894 A | 8/1977 | Knibbe et al. |
| 4,049,252 A | 9/1977 | Bell |
| 4,066,943 A | 1/1978 | Roch |
| 4,284,033 A | 8/1981 | del Rio |
| 4,531,474 A | 7/1985 | Inuta |
| 4,673,839 A | 6/1987 | Veenendaal |
| 4,755,746 A | 7/1988 | Mallory et al. |
| 4,899,998 A | 2/1990 | Teramachi |
| 4,904,933 A | 2/1990 | Snyder et al. |
| 4,963,364 A | 10/1990 | Fox et al. |
| 5,321,352 A | 6/1994 | Takebuchi |
| 5,479,108 A | 12/1995 | Cheng |
| 5,481,936 A | 1/1996 | Yanagisawa |
| 5,571,324 A | 11/1996 | Sago et al. |
| 5,669,316 A | 9/1997 | Faz et al. |
| 5,670,888 A | 9/1997 | Cheng |
| 5,676,360 A | 10/1997 | Boucher et al. |
| 5,685,232 A | 11/1997 | Inoue |
| 5,811,751 A | 9/1998 | Leong et al. |
| 5,883,522 A | 3/1999 | O'Boyle |
| 5,959,461 A | 9/1999 | Brown et al. |
| 5,982,166 A | 11/1999 | Mautz |
| 6,483,336 B1 * | 11/2002 | Harris et al. ............ 324/765 |

FOREIGN PATENT DOCUMENTS

JP 2002033374 A * 1/2002 ............ G01R/31/26

* cited by examiner

*Primary Examiner*—David A. Zainebe
*Assistant Examiner*—Jermele Hollington
(74) *Attorney, Agent, or Firm*—Chernoff, Vilhauer, McClung & Stenzel, LLP

(57) ABSTRACT

The arrangement of test points on an integrated circuit (IC) undergoing testing in a probe station often requires rotation of the IC or the probes when performing a series of tests. A chuck with indexed rotation promotes rapid rotation of the device under test to a new test position and increases the productivity of the probe station. The device under test is mounted on a device mounting member that is affixed to a shaft rotationally mounted in a base. A resilient seal supports the device mounting member and forms a sealed chamber over a substantial part of the area of the device mounting member. Applying vacuum or pressure to the sealed chamber urges the device mounting member and base toward contact. The support provided by the resilient seal over substantial portion of device mounting member's diameter promotes stability and consistent planarity of the device mounting member without regard to the orientation of the shaft to device mounting member.

14 Claims, 4 Drawing Sheets

INDEXING ROTATABLE CHUCK FOR A PROBE STATION

CROSS-REFERENCE TO RELATED APPLICATIONS

This is a continuation of application Ser. No. 09/564,591, filed May 3, 2000 now U.S. Pat. No. 6,483,336.

BACKGROUND OF THE INVENTION

The present invention relates to a chuck for a probe station and, more particularly, to an indexing, rotatable chuck for securing a device under test in a probe station.

Integrated circuits (ICs) comprise micro-circuits chemically etched on semiconductor material or wafers. It is customary to manufacture several ICs on a single wafer and then separate the individual circuits after performance and functional testing in a wafer probe station. Probe stations are also used for testing the performance and function of an IC after the IC has been incorporated into a composite device.

Generally, a probe station comprises an environmental chamber containing a chuck for securing and positioning the device under test (DUT), one or more probes to connect test points on the DUT with instrumentation, and optics to assist the operator in locating and probing test points on the IC. The environmental chamber protects the DUT and the delicate probes from electrical and other environmental hazards. The chuck provides the mechanism for securing and positioning the DUT. The chuck may also include means to further control the local operating environment, such as heating and cooling capabilities and additional electromagnetic field isolation. To test a device, the probe station operator examines the device under a microscope and, using positioning mechanisms for the chuck and probes, brings a probe tip into contact with a test point on the DUT. The test points on ICs are customarily laid out along rectangular grid coordinates and may be tested with multiple probes on a probe card or by single probes in a north-south-east-west arrangement. Likewise, ICs in a composite device are typically arranged along rectangular coordinates.

To facilitate co-location of the probe tip and the test point on the DUT, both the probe and the chuck may be capable of movement in several directions. The chuck is typically mounted on a movable stage providing horizontal (x and y axes) and vertical (z axis) translation. In addition, the stage may provide for rotation about the z axis or "theta angle" adjustment to facilitate parallel alignment of the probe tips and the test points on the IC. Typically, the mounting for the probe provides for x, y, and z movement of the probe tips with micrometer precision.

While test points are commonly arranged in a rectilinear grid arrangement on the IC, a sequence of tests may require probing pluralities of test points that are not arranged along the same xy axis. Even if test points on an IC are laid out with efficient probing in mind, the test points for devices containing multiple ICs are likely not to be conveniently arranged. As a result, either the DUT must be rotated on the chuck or the probe card must be removed and rotated to reorient the probe tips between tests. In addition to the time and effort required to reorient the DUT or the probe card, reorientation of the probes may require time consuming re-calibration of the attached instrumentation. The time required to reorient the probe and test points can be reduced by providing for rotation of the chuck about the vertical (z) axis (theta rotation).

Rotational movement in the form of "fine" theta adjustment is typically provided in probe station chucks. The fine theta adjustment is used to ensure that an array of DUTs are aligned with the x and y axis of the probe station so that the probe can step from device to device without further adjustment. The fine theta rotation is typically limited to about plus or minus seven and one half degrees (±7.5°) and the rotation speed is relatively slow to facilitate alignment of the microscopic probe tips and test points. Therefore, the fine theta adjustment mechanism is not adequate or convenient for rotating the DUT through substantial angles, often 90 degrees or more, to accommodate reorientation of test points for a sequence of tests.

Roch, U.S. Pat. No. 3,936,743, HIGH SPEED PRECISION CHUCK ASSEMBLY, discloses a rotating chuck for a wafer probe station. The chuck comprises a platform having a stem portion arranged for rotation in a bearing in a housing bore. The chuck is rotated manually by turning an adjustment knob and attached worm gear. The worm gear engages a spur gear attached to the rotating platform of the chuck. Although this mechanism permits rotation of the surface of the chuck to facilitate reorientation of the DUT, the worm gear drive adds mass to the chuck increasing wear and tear on the positioning mechanism of the stage and making accurate positioning by the stage more difficult. In addition, the planarity of the mounting surface is dependent upon the perpendicularity of the supporting stem and corresponding bore in the support structure. Since positioning is performed while observing the DUT under a microscope, even slight deviation in planar orientation or planarity can result in a need to routinely refocus the optics while positioning the DUT for probing. The worm gear mechanism also increases the height of the chuck which may dictate that the stage, optics, and environmental chamber of the probe station be specially designed to accommodate the rotating chuck. Further, while the worm gear drive provides continuous rotation of the DUT for precise re-alignment, it does not provide the rapid and convenient positioning of the DUT to a new test position which is important to productive probe testing.

Boucher et al., U.S. Pat. No. 5,676,360, MACHINE TOOL ROTARY TABLE LOCKING APPARATUS, disclose another worm gear driven rotary table. This table is adapted for use with a dicing saw. The planar orientation of the surface of the table is established by the orientation of the shaft on which the table rotates relative to the top surface of the table. As a result, the bearings supporting the table for rotation are widely spaced increasing the height of the table. The table does incorporate a brake to lock the table in a selected rotational position. Fluid pressure urges a circular piston to bear on a ledge on the periphery of the rotating table. Since the piston is free to assume any position relative to the table's base, application of the brake does not stabilize the table or effect its planar orientation. Further, a more massive table is required to resist deflection resulting from application of the brake force on the table's periphery.

What is desired, therefore, is a compact rotating chuck featuring rigidity, low mass, and precise planarity while facilitating rapid and accurate rotation of the DUT through a substantial angle for sequential probing of IC test points.

SUMMARY OF THE INVENTION

The present invention overcomes the aforementioned drawbacks of the prior art by providing a chuck for a probe station comprising a base attached to the probe station; a shaft mounted for rotation in the base; and a device mounting member affixed to the shaft for rotation therewith and having a planar orientation relative to said base substantially independent of the orientation of the shaft to the device mounting member. A large diameter resilient seal between the base and the device mounting member supports the device mounting member independent of the alignment of the shaft promoting rigidity and consistent planarity. Further, this method of support reduces the length of the shaft and, consequently, the height and mass of the rotary chuck. In addition, the rotary chuck can include a releasable rotation stop to permit indexed rotation of the device mounting member to a new test position. In another embodiment, a chuck for a probe station comprises a base attached to the probe station and a device mounting member constrained by the base for rotation relative thereto.

The foregoing and other objectives, features and advantages of the invention will be more readily understood upon consideration of the following detailed description of the invention, taken in conjunction with the accompanying drawings.

DETAILED DESCRIPTION OF THE PREFERRED EMBODIMENT

Figure 1:
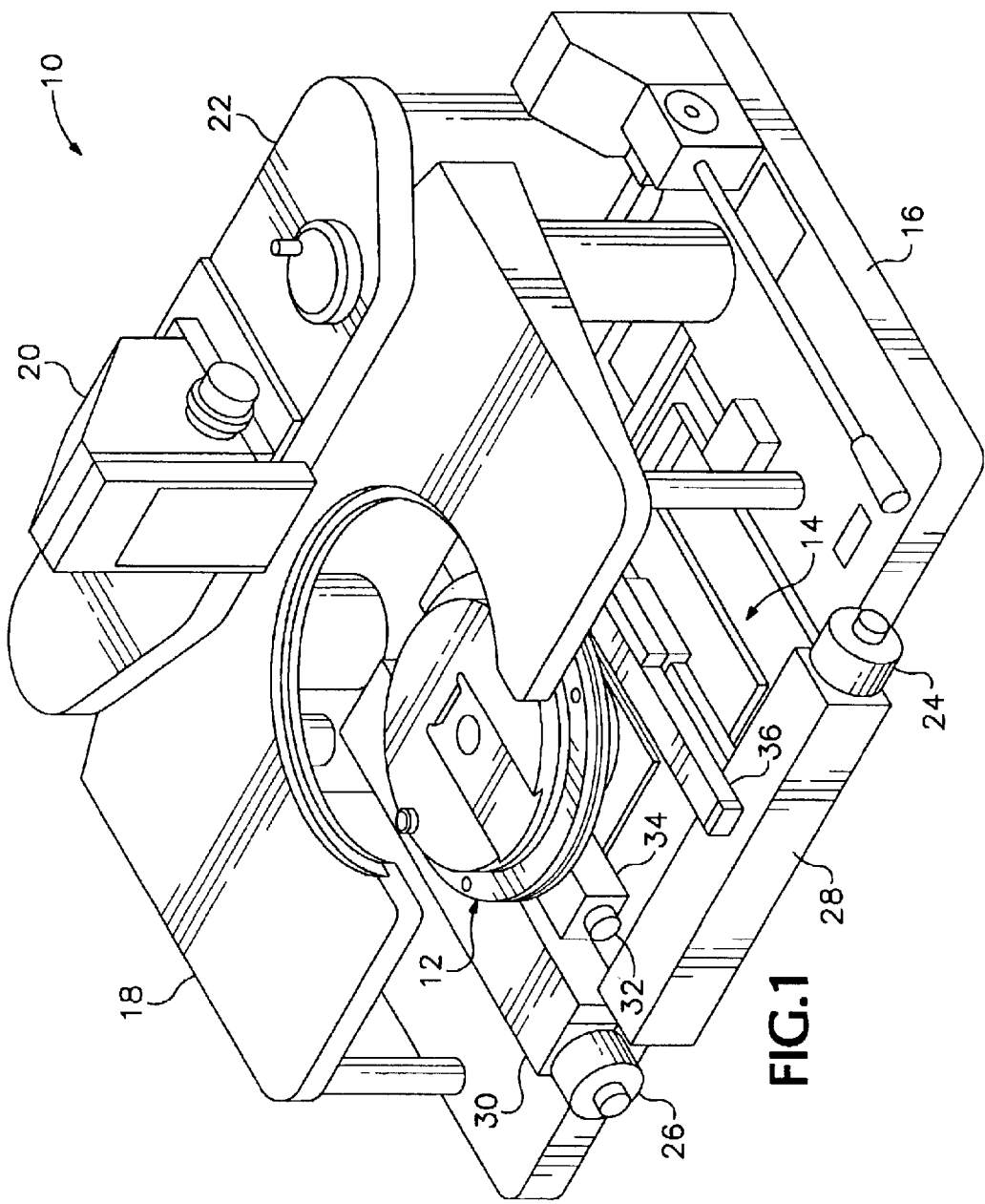
FIG. 1 is perspective illustration of an exemplary probe station and chuck.

Referring to FIG. 1, in a probe station 10 a device under test (DUT) is mounted on a chuck 12 which is supported on a movable stage 14 mounted on a station base 16. Probes (not illustrated) are supported over the chuck by a platen 18. The probes are provided with controls for positioning along horizontal (x and y) axes and the platen 18 may be adjusted in the vertical (z) direction to bring the probes into contact with test points on the integrated circuit of the DUT. To facilitate location and positioning of the probes, the probe station 10 includes a microscope (not illustrated) mounted on a microscope mounting 20 attached to an optics bridge 22. The probe station 10 may include an environmental housing (not illustrated) to protect the DUT and probes from dust and other environmental hazards.

To facilitate relative positioning of the DUT and probes, the stage 14 provides for translatory and limited rotational (theta) movement of the chuck 12. In the probe station 10 illustrated in FIG. 1, horizontal translation is accomplished with an x-motor 24 and a y-motor 26 that drive linear actuators 28 and 30 to move the stage 14. A similar mechanism (not shown) provides vertical translation of the chuck 12. Rotation about the vertical axis or fine theta adjustment is provided by a theta motor 32 and attached linear actuator 34. The fine theta adjustment is provided to facilitate parallelism of the probe tips and test points. Rotation is typically limited to approximately 15 degrees (±7.5°). Rotational speed is relatively slow to facilitate alignment of the microscopic probe tips and test points. One or more linear encoders 36 provide feedback to a control for the stage positioning motors.

Figure 2:
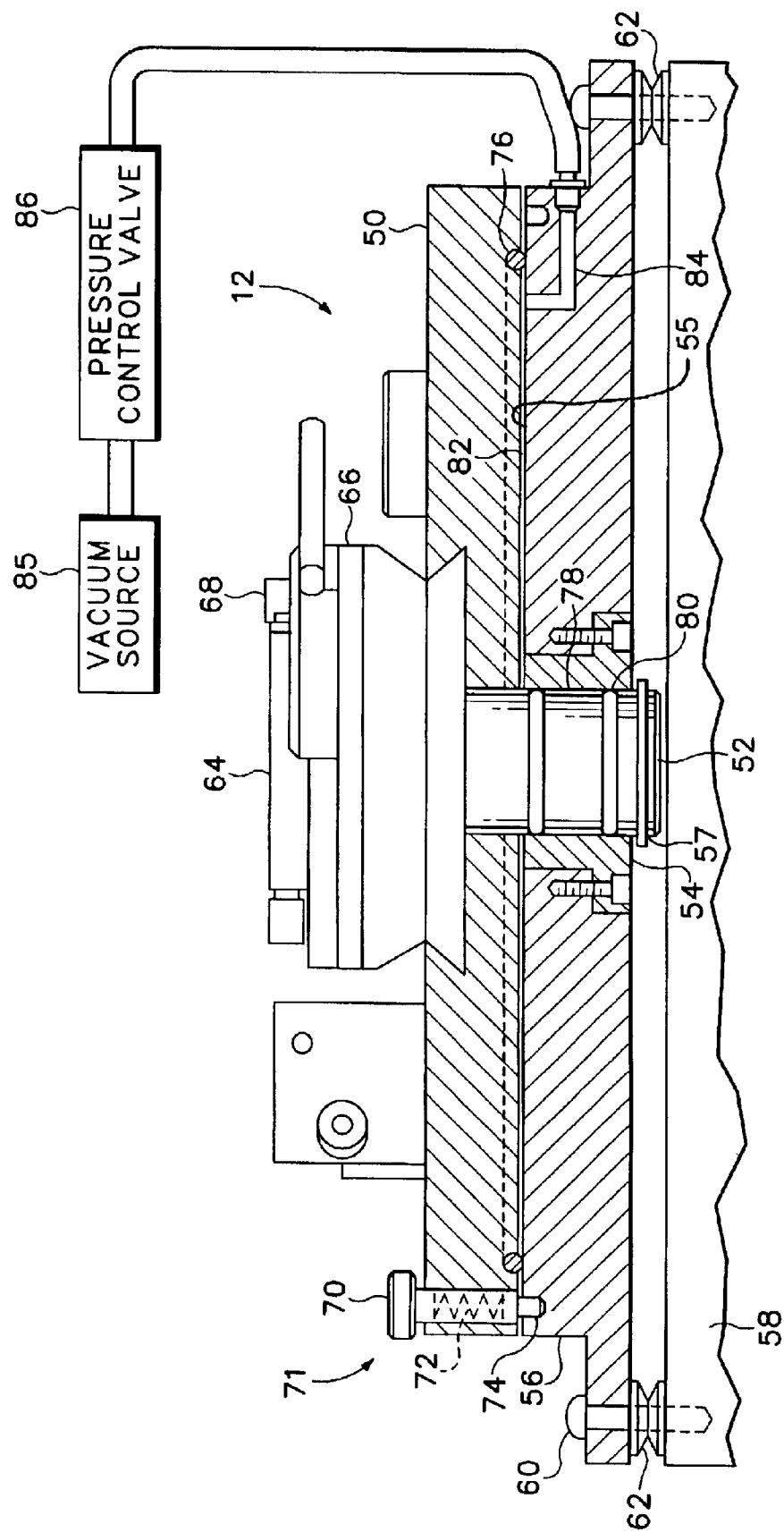
FIG. 2 is a cross section of an indexing, rotatable chuck.

Referring to FIG. 2, the chuck 12 of the present invention comprises a device mounting member 50 attached to a shaft 52 that is mounted for rotation in a bushing 54 installed in a bore in a base 56. A retaining ring 57 secures the shaft 52 in the bushing 54. The base 56 is secured to a planarization plate 58 which is, in turn, attached to the stage 14 of the probe station 10 as illustrated in FIG. 1. The base 56 is attached to the planarization plate 58 by an arrangement of mounting screws 60 and a plurality of spring washers 62 retained by each of the mounting screws 60. The spring washers 62 are interposed between the base 56 and the planarization plate 58 and exert a force to separate the base 56 and the planarization plate 58. The planarity of the upper surface of the device mounting member 50, relative to the structure of the probe station 10, can be adjusted by loosening or tightening one or more of the base mounting screws 60.

A handle (not illustrated) can be installed in the device mounting member 50 for convenient manual rotation of the device mounting member 50. The base 56 and the rotating device mounting member 50 can be provided with corresponding markings to indicate the angle of rotation. Manual rotation provides rapid and reliable rotation of the device mounting member 50 but rotation could be powered by a motor and a suitable drive train (not illustrated). Positioning of a powered device mounting member 50 can be controlled by a known motor controller and rotary position feedback device.

In the embodiment of the chuck 12 in FIG. 2, a device under test (DUT) 64 is secured to a mounting fixture 66 by clamps 68. The mounting fixture 66 is, in turn, secured to the device mounting member 50 by a dovetail that mates with a corresponding dovetail groove in the device mounting member 50.

Other methods of securing the DUT 64 could be used. For example, wafers are often retained on the surface of a chuck by vacuum means. Apertures (not illustrated) provided in the upper surface of the device mounting member 50 can be connected to a vacuum source (not illustrated) through a rotating union (not illustrated) and passageways in the device mounting member 50 and shaft 52. When the vacuum source is connected to the passageways, air pressure will restrain the DUT on the upper surface of the device mounting member 50.

Since the test points of ICs are typically arranged along rectangular coordinates, rotation of the DUT in 90 degree or quadrature increments is commonly required during testing. The inventors concluded that rapid rotation of the DUT 64 to a precise, but approximate, theta angle followed by fine theta angle adjustment to align the probes and contact points would substantially improve the productivity of the probe station. The chuck 12 of the present invention includes a mechanical indexing apparatus to speed precise rotation of the device mounting member 50 to a new position. A rotation stop 71 is provided to releasably index or limit the rotation of the device mounting member 50. A first example of a rotation stop 71 comprises a stop member 70 in the form of a manually operated indexing pin that slidably engages a bore in the device mounting member 50 and, in an extended position, engages one of a plurality of bores 74 or other surfaces of the base 56. The indexing pin 70 is biased to an extended position by a spring 72. To rotate the device mounting member 50, the indexing pin 70 is retracted from the bore 74 in the base 56, freeing the device mounting member 50 for rotation. The indexing pin 70 may be retained in a retracted position by a second motion, such as a quarter turn rotation of the pin, providing chuck rotation without indexing. While the rectilinear arrangement of test points on ICs makes rotation in 90 degree or quadrature increments convenient in many applications, indexing in other angular increments is possible by providing pin receiving bores 74 at other or additional locations in the base 56. The rotation stop could take other forms comprising a stop member 70 movably mounted to one element, either the device mounting member 50, the shaft 52 or the base 56, and engaging another element of the chuck 12. For example, the indexing pin stop member 70 could be slidably mounted in a bore in the base 56 and engage bores or surfaces in the device mounting member 50. Alternative examples of a rotation stop, include a flip-up arm stop member or a spring loaded plunger or ball detent stop member engaging features of the device mounting member 50, the shaft 52, or the base 56. For example, referring to FIG. 3, an alternative example of a rotation stop 103 releasably limiting rotation of the device mounting member 92 comprises a ball stop member 104 movable in a bore in the base 94 and urged into contact with an indentation in a surface of the device mounting member 92 by a spring 102.

The rotatable chuck 12 of the present invention also includes a rotational braking and stabilization system. The system permits locking the device mounting member 50 in an infinite number of rotational positions. In addition, the system promotes stability and planarity of the DUT 64 during testing, increasing the productivity of the probe station by reducing required microscope adjustments. The stability and planarity of the device mounting member 50 are improved by supporting the device mounting member at widely separated points with a resilient member 76, for example a large diameter o-ring. The o-ring 76 is installed in an o-ring groove in the lower surface of the device mounting member 50 and bears on the upper surface 55 of the base 56 exerting a separating force between the device mounting member 50 and the base 52. During rotation, the device mounting member 50 is supported across a substantial portion of its diameter by the resilient, large diameter o-ring 76 producing a stable mounting for the DUT 64. Further, the planar orientation of the device mounting member 50 is not dependent on the orientation of the mounting shaft 52 relative to the device mounting member. Widely separated bearings and a long shaft are not required, reducing the height of the chuck 12.

Additional o-ring vacuum seals 78 and 80 are installed in o-ring grooves in the shaft 52 to seal between the shaft 52 and the bushing 54. The o-ring vacuum seals 76, 78, and 80 form a sealed chamber 82 between the device mounting member 50 and the base 56. A passageway 84 in the base 56 connects the sealed chamber 82 to a pressure control comprising a vacuum source 85 and a control valve 86. When the control valve 86 is actuated, air flows from the sealed chamber 82 to the vacuum source 85 and air pressure acting on the device mounting member 50 urges the device mounting member 50 toward contact with the base 56. In other words, the device mounting member 52, the base 56, and the seals 78, 80, and 76 form an actuator responsive to changes in fluid pressure. Friction between the device mounting member 50, the o-ring seal 76, and the base 56 retards rotation of the device mounting member 50 and locks it into position. The resilient member, o-ring 76, is compressed as the device mounting member 50 and base 56 are pressed together and the device mounting member 50 is supported over a substantial portion of its surface area when the brake is applied. The planar orientation of the upper surface of the base 56 is adjusted with the screws 60 that support the base on the planarization plate 58. The planar orientation or planarity of the upper surface of the device mounting member 50 is determined by parallelism of the upper and lower surfaces of the device mounting member 50 and is not dependent upon the orientation of the shaft 52 relative to the device mounting member 50. As a result, the deviation in the planar orientation of the mounting for the device under test is minimized by the ability to control the parallelism of the top and bottom surfaces of the device mounting member 50 and a relatively short shaft 52 can be used to mount the device mounting member 50 minimizing the height of the rotary chuck. Minimizing deviation of the planar orientation of the device mounting member 50 and, consequently, the DUT avoids frequent refocusing of the optics as the DUT is rotated or translated. Minimizing the height of the rotating chuck makes it possible to install the chuck 12 in a probe station designed for a non-rotating chuck.

Figure 3:
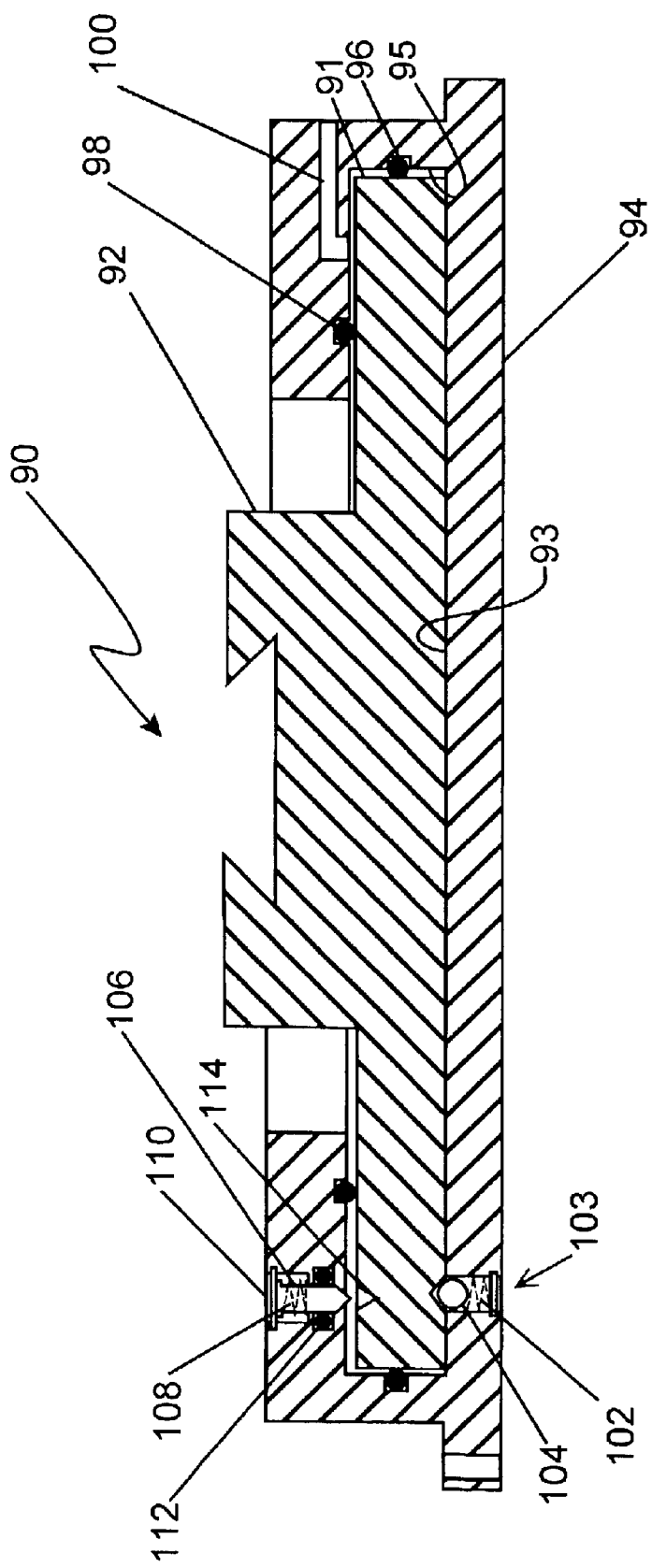
FIG. 3 is a cross section of an indexing rotatable chuck of alternative construction.

Referring to FIG. 3, in an alternative construction the device mounting member 92 of the chuck 90 is supported for rotation on the surface 93 of the base 94 without a central shaft. An o-ring seal 96 mounted in an o-ring groove in a surface 95 in an extension of the base 94 bears on the periphery 91 of the device mounting member to journal the device mounting member 92 for rotation. During rotation the device mounting member 92 is supported by the base 94 across the diameter of the device mounting member 92 providing rigid support and stable planar orientation. A second o-ring 98 seals an annular volume between an upper surface of the device mounting member 92 and the extension of the base 94. When vacuum is applied to the sealed annular volume through a passageway 100, the device mounting member 92 is drawn upward toward the extension of the base 94, compressing the o-ring 98. As a result, braking force is applied over an annular area approximating the diameter of the upper surface of the device mounting member 92 and the planarity of the device mounting member is determined by the flatness of this surface. Approximate indexing of the rotation of the device mounting member is provided by a ball detent comprising a spring 102 that urges a ball 104 into contact with an indentation in the lower surface of the device mounting member 92. In addition, a locating pin 106 having a conical tip is slidably arranged in a bore in the device mounting member 92. The locating pin 106 is retained in a retracted position by a spring 108 that is retained by a snap ring 110. The locating pin 106 is sealed by an o-ring 112. When a vacuum is applied to the chamber formed by the device mounting member 92 and the base 94, the locating pin 106 is drawn into contact with a conical shaped indentation 114 in the device mounting member providing final rotational alignment of the device mounting member 92.

Figure 4:
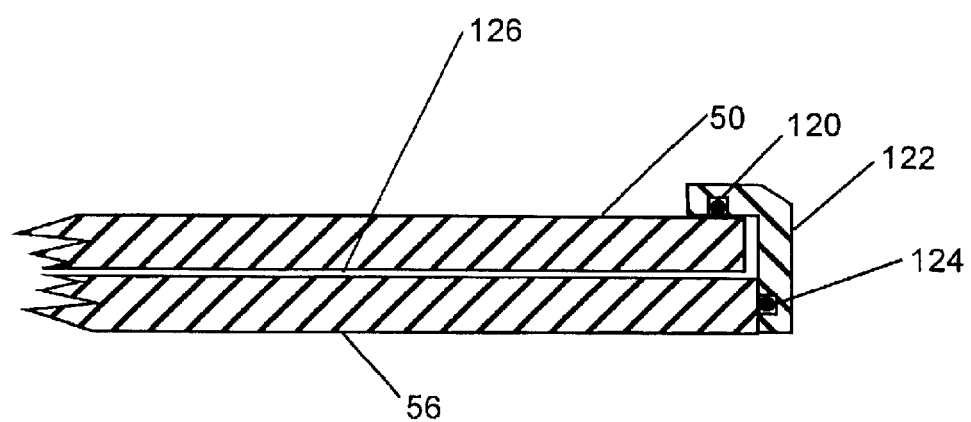
FIG. 4 is a fragmentary view of a cross section of an indexing, rotatable chuck arranged for braking by a pressurized fluid.

Vacuum is a convenient energy source for actuating the braking and stabilizing system because vacuum is often used to secure wafers and other DUTs on the chuck. However, increased fluid pressure can be used to actuate the braking and stabilization mechanism. As illustrated in FIG. 4, the large diameter o-ring seal 120 can be installed in a seal ring 122 affixed to the periphery of the base 56. A second o-ring 124 may be used to seal between the seal ring 122 and the base 56. The seals 91 and 90 in conjunction with seals on the shaft (not illustrated) form a sealed fluid chamber 126 between the device mounting plate 50 and the base 56. When pressurized fluid is directed to the chamber 126, the upper surface of the device mounting plate 50 is pressed upward against the seal 120 and seal ring 122. With this arrangement, the planarity of the upper surface of the device mounting member 50 is determined by the flatness of that surface.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

What is claimed is:

1. A chuck for a probe station, said chuck comprising:
   (a) a base attached to said probe station and having a planar orientation relative thereto;
   (b) a shaft mounted for rotation in said base; and
   (c) a device mounting member affixed to said shaft for rotation with said shaft, said device mounting member having another planar orientation relative to said base substantially independent of an orientation of said shaft to said device mounting member.

2. The apparatus of claim 1 further comprising a rotation stop releasably limiting rotation of said device mounting member relative to said base.

3. The apparatus of claim 2 wherein said rotation stop comprises a stop member movably mounted to one of said device mounting member and said base and arranged for selective engagement with a surface of the other of said device mounting member and said base.

4. The apparatus according to claim 3 wherein said rotation stop is arranged to limit rotation of said device mounting member in quadrature increments.

5. The apparatus of claim 1 further comprising a resilient member supporting said device mounting member for rotation relative to said base and defining said another planar orientation of said device mounting member relative to said base.

6. A chuck for a probe station, said chuck comprising:
   (a) a base attached to said probe station, said base comprising a base surface;
   (b) a device mounting member rotationally constrained to said base and resiliently supported on said base surface for rotation relative to said base; and
   c) a stop member movably mounted to one of said device mounting member and said base and arranged for selective engagement with a surface of the other of said device mounting member and said base, said stop member releasably limiting rotation of said device mounting member relative to said base.

7. A rotatable chuck for a probe station, said rotatable chuck comprising:
   (a) a base attached to said probe station;
   (b) a device mounting member rotationally mounted to said base; and
   (c) a resilient member in contact with said base and said device mounting member, said resilient member supporting said device mounting member on said base during rotation but not constraining said device mounting member for rotation relative to said base.

8. The apparatus of claim 7 further comprising a rotation stop including a stop member movably attached to one of said base and said device mounting member and releasably engaging the other of said base and said device mounting member to releasably limit rotation of said device mounting member.

9. The apparatus according to claim 8 wherein said rotation stop is arranged to limit rotation of said device mounting member in quadrature increments.

10. A chuck for a probe station, said chuck comprising:
    (a) a base attached to said probe station, said base comprising a first base surface and a second base surface, said second base surface being substantially normal to said first base surface; and
    (b) a device mounting member having a periphery and a first surface, said first surface of said device mounting member being supported by said first base surface and said periphery being engaged by said second base surface to constrain said device mounting member for rotation relative to said base.

11. A chuck for a probe station, said chuck comprising:
    a base attached to said probe station, said base comprising a base surface;
    a device mounting member having a periphery, said device mounting member supported by said base surface and constrained at said periphery by said base for rotation relative to said base; and
    a stop member movably attached to said device mounting member and arranged to selectively engage a stop surface on said base, said stop surface arranged on an axis intersecting said base surface.

12. The apparatus of claim 10 further comprising a stop member movably attached to said base and arranged to selectively engage a stop surface on said device mounting member, said stop surface being arranged on an axis substantially parallel to an axis of rotation of said device mounting member.

13. The apparatus according to claim 12 further comprising a second stop surface, said second stop surface arranged to limit rotation of said device mounting member in a quadrature increment.

14. The apparatus of claim 10 further comprising a resilient member in contact with said device mounting member and said base and defining a planar orientation of said device mounting member relative to said base.

* * * * *

UNITED STATES PATENT AND TRADEMARK OFFICE
CERTIFICATE OF CORRECTION

PATENT NO. : 6,771,090 B2
DATED : August 3, 2004
INVENTOR(S) : Harris et al.

It is certified that error appears in the above-identified patent and that said Letters Patent is hereby corrected as shown below:

Column 8,
Line 26, change "a base attached to" to -- (a) a base attached to --.
Line 28, change "a device mounting member" to -- (b) a device mounting member --.
Line 33, change "a stop member movably" to -- (c) a stop member movably --.

Signed and Sealed this

Third Day of January, 2006

JON W. DUDAS
*Director of the United States Patent and Trademark Office*